United States Patent [19]

Rosier

[11] 4,040,038
[45] Aug. 2, 1977

[54] COLUMN ACCESSING OF ELEMENTS IN CONFINED ARRAYS

[75] Inventor: Laurence L. Rosier, San Jose, Calif.

[73] Assignee: International Business Machines Corporation, Armonk, N.Y.

[21] Appl. No.: 429,601

[22] Filed: Jan. 2, 1974

[51] Int. Cl.² .............................................. G11C 19/08
[52] U.S. Cl. ........................ 340/174 TF; 340/174 EB; 340/174 VA
[58] Field of Search ................................. 340/174 TF

[56] References Cited

U.S. PATENT DOCUMENTS

| 3,683,307 | 8/1972 | Patterson | 338/99 |
| 3,944,842 | 3/1976 | Dorleijn | 340/174 TF |

FOREIGN PATENT DOCUMENTS

| 7,110,674 | 2/1973 | Netherlands | 340/174 TF |

OTHER PUBLICATIONS

Applied Physics Letters—vol. 23, No. 8, Oct. 15, 1973, pp. 485–487.
American Institute of Physics Conference Proceedings, No. 5, Part I Nov. 16–19, 1971, pp. 130–134.
American Institute of Physics Conference Proceedings No. 10, Part I, Nov. 28–Dec. 1, 1972, pp. 373–377.

Primary Examiner—James W. Moffitt
Attorney, Agent, or Firm—Jackson E. Stanland

[57] ABSTRACT

A technique for accessing interactive elements, such as magnetic bubble domains, which are in confined arrays where the elements are located with respect to one another in accordance with interactions therebetween. In order to improve the access time to any element within the confined array, the elements are removed in a direction substantially transverse to the direction of their translational movement within the confined array. In particular, this technique is useful for accessing columns of magnetic bubble domains in a lattice array of bubble domains. A bubble pump device is utilized to remove the interactive elements from the array. The bias field conditions for this pump propagation structure are the same as for the lattice. Bubble domains can be removed from the lattice and returned to their positions within the lattice.

54 Claims, 6 Drawing Figures

COLUMN ACCESSING OF ELEMENTS IN CONFINED ARRAYS

CROSS REFERENCE TO RELATED APPLICATIONS

Copending application Ser. No. 429,602, filed Jan. 2, 1974 and now U.S. Pat. No. 3,913,079, describes a pump propagation structure for moving interactive elements, and in particular for moving magnetic bubble domains. Bubble domains confined to move in a certain direction are moved in that direction by localized magnetic fields which expand bubble domains, thereby forcing other bubble domains to move in the preferred direction.

BACKGROUND OF THE INVENTION

1. Field of the Invention

This invention relates to techniques for improving the access time in systems using arrays of interactive elements, and in particular for improving the access time of magnetic bubble domains in a system using a confined array (lattice) of such bubble domains.

2. Description of the Prior Art

The concept of using a lattice of interactive elements in information handling systems was first presented in copending application Ser. No. 395,336, filed Sept. 7, 1973 now abandoned. In that application, an embodiment showed a large array of magnetic bubble domains confined within a rhombus shape. These bubble domains interact with one another and have positions within the rhombus which are substantially determined by those interactions. In that system, access to bubble domains within the lattice array took place by serially removing a column of bubbles from one of the ends of the lattice. Once the first column of bubble domains has been removed, the second column is then serially removed.

In the lattice arrangements described hereinabove, the access time to a random bit of information in the lattice is approximately equal to ($\frac{1}{2}$) $N_B T$, where $N_B$ is the total number of bubble domains in the confined rhombus and T is the basic cycle time of the system. The basic cycle time is the time required to move a bubble domain several bubble diameters. For large systems, $N_B$ may be $10^8$ and T may be 1 microsecond. In that situation, the access time for a random bit would be 50 seconds.

The access time can be improved by decreasing the block size (lattice size) and increasing the number of blocks per magnetic chip. However, this approach leads to a large number of connections to the magnetic chip.

Accordingly, it is a primary object of the present invention to provide a technique for extracting information from a lattice of interactive elements with minimum access time.

It is another object of the present invention to provide a technique for accessing interactive elements within a lattice of such elements by means which provide only a minimum number of interconnections.

It is a further object of this invention to provide a technique for readily accessing information from a lattice of interactive elements wherein the information state can be replaced within the lattice.

It is still another object of this invention to provide a system utilizing a lattice of interactive elements including structure for moving elements within the lattice and for removing elements from the lattice in a direction substantially transverse to the direction of movement of elements within the lattice.

It is a further object of this invention to provide techniques for reducing information access time in systems using lattices of magnetic bubble domains.

Brief Summary of the Invention

The column access technique proposed herein does not serially move information from one end of a lattice to the other for extracting the interactive elements. Instead, the interactive elements are removed from the lattice in a direction substantially transverse to the direction defined by the prior art lattice systems where information is put in at one end of the lattice and removed at the other end of the latice. Consequently, elements can be removed from interior positions of the lattice, rather than having to be removed from positions at the ends of the lattice.

Means are provided for translating the lattice and for extracting interactive elements from the lattice in a direction substantially transverse to the direction of translation of elements within the lattice. Additionally, means are provided to return the extracted information into the same positions within the lattice, or for regenerating the removed information. In particular, the bubble pump shift register described in aforementioned Ser. No. 429,602 can be utilized for removal of a column of interactive elements from the lattice. After detection of the removed elements, new elements having the same information state can be inserted into the lattice, or the same elements can be returned to the lattice.

Although the use of many types of interactive elements can be foreseen, a particularly good example is provided using magnetic bubble domains. Thus, the following description will be concerned with magnetic bubble domains, although other variations can be utilized. For instance, styrofoam elements (as shown in Ser. No. 395,336) having magnetic elements embedded therein can float on a suitable medium, such as water. These elements will interact with one another in the same manner as magnetic bubble domains and can therefore be moved on the water surface by the column accessing structure of the present invention. If the styrofoam balls are color coded, information storage and displays are readily provided.

These and other objects, features, and advantages will be more apparent from the following more particular description of the preferred embodiments.

DETAILED DESCRIPTION OF THE PREFERRED EMBODIMENTS

Figure 1:
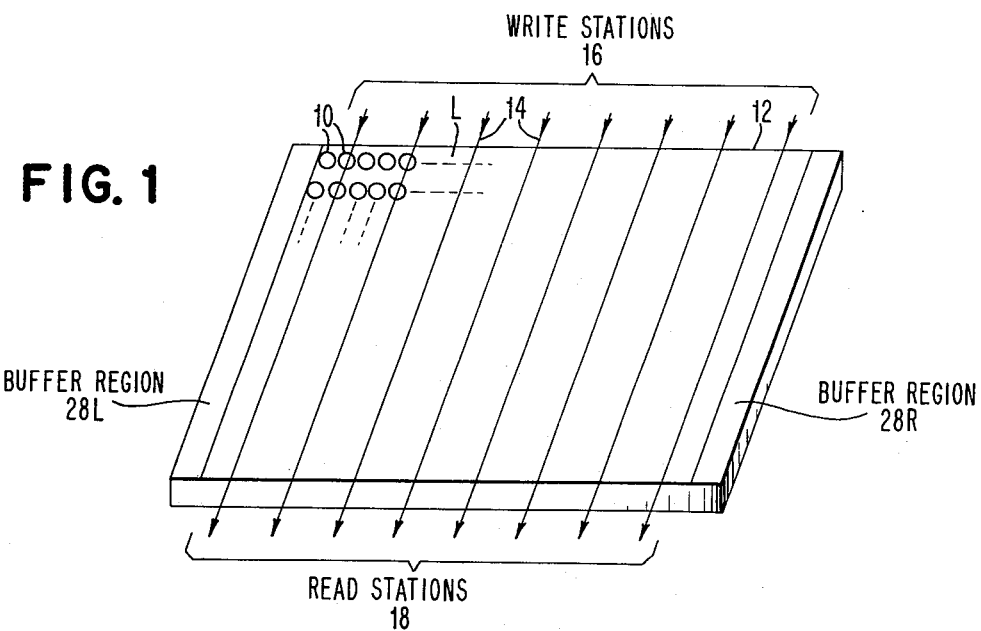
FIG. 1 is a conceptual drawing illustrating the principle of column accessing.

FIG. 1 is a conceptual illustration showing how column accessing works. A lattice L of interactive elements 10, such as magnetic bubble domains, is held within a confinement means 12. This confinement means is any type of structure which provides a magnetic barrier to the bubble domains 10. For instance, such confinement means can be comprised of permalloy strips, ion implanted regions, and etched grooves in the bubble domain material. All of these structures are described in more detail in aforementioned copending application Ser. No. 395,336.

Buffer regions are located on the left and right-hand ends of the lattice L and are used for translation of the lattice to the left or to the right. Conductor lines can be used to move stripe domains and bubble domains in the buffer regions to implement bubble domain translation to the left or to the right.

Vertically displaced arrows 14 are used to indicate the direction of movement of columns of bubble domains 10. That is, a plurality of write stations 16 is provided at the top of lattice L and a plurality of read stations 18 is provided at the bottom of lattice L, in order to define a plurality of input/output ports. Bubble domains 10 are moved in the direction of the arrows to the read stations 18 and then destroyed or returned to the same locations within lattice L, after the read operation.

In FIG. 1, it is noted that normal lattice translation is in a horizontal direction from left to right, or the reverse. However, elements are removed from the lattice in a direction substantially transverse to this. Also, elements can be removed from interior positions or end positions of the lattice. This is in distinction with the lattice arrangement of aforementioned Ser. No. 395,336, where columns of bubble domains are entered into the lattice along the left-hand end and removed from the lattice at the right-hand end of the lattice.

Provision of a plurality of write stations 16 and read stations 18, together with means for propagating the bubble domains along the paths indicated by the arrows, produces column accessing. As the number of input-output ports is increased, the amount of lattice translation (along the horizontal direction) is decreased at the expense of the number of chip connections. A reasonable design for a system might comprise $10^8$ magnetic bubble domains, and 8 input-output ports. This would lead to a ratio of storage area/(storage area + buffer area) = 8/9. For a cycle time of 1 microsecond, the access time to any random bubble domain would be 10 milliseconds.

FIG. 2

Figure 2:
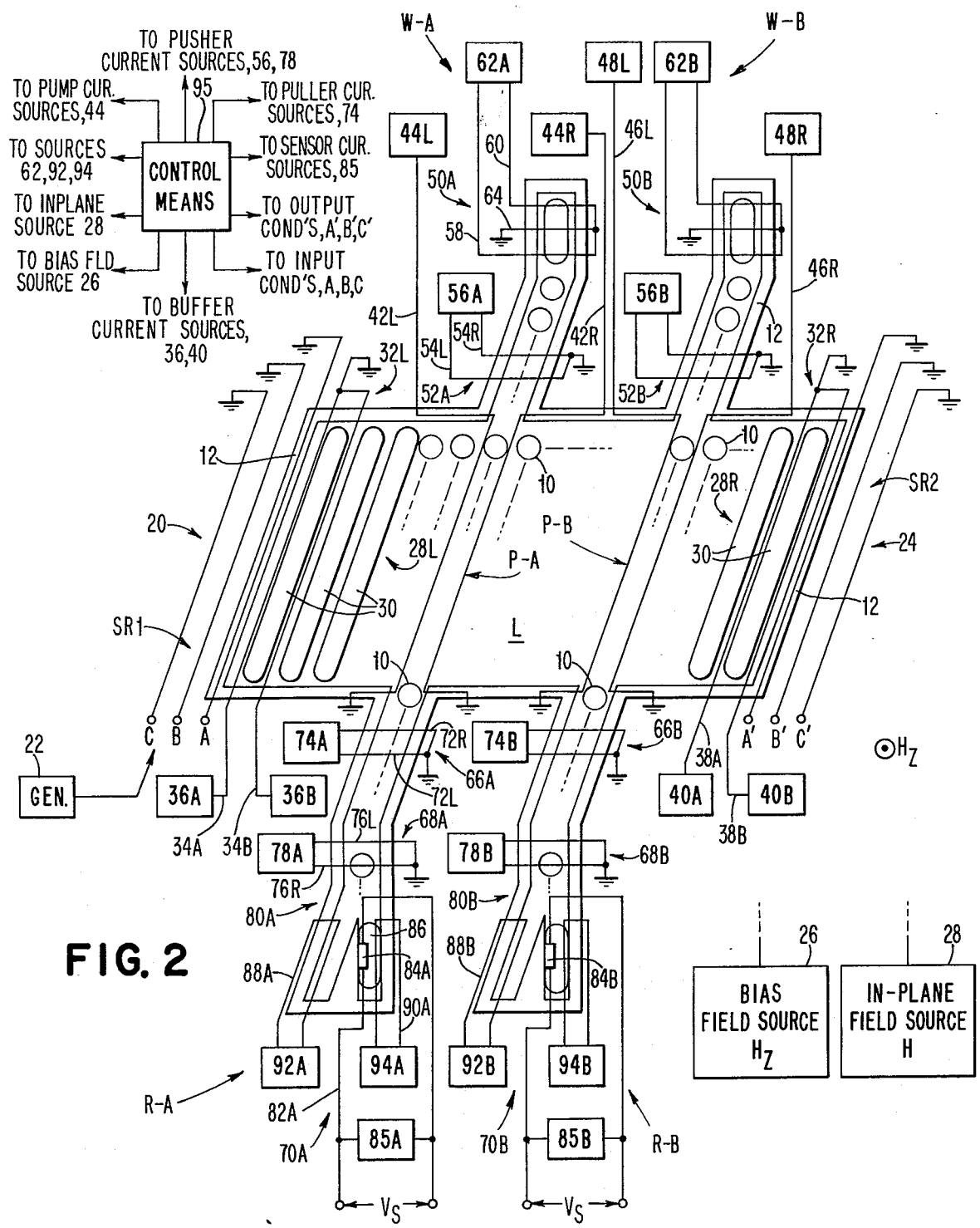
FIG. 2 is a detailed diagram of an overall system configuration for implementing column accessing of elements within a lattice.

FIG. 2 shows a detailed diagram of structure required to implement column accessing of bubble domains within a lattice array. Individual portions of this circuit will be shown in more detail in subsequent FIGS. 3-7.

In more detail, a lattice array L of magnetic bubble domains 10 is confined within the confinement means 12. Confinement means 12 is a barrier to the escape of bubble domains 10 and serves to keep these domains within a confined area. As is apparent, the confinement barrier is also used for the columns (input/output) which extend transversely to the lattice.

At the left-hand end of the confinement means 12 is an input means generally designated 20. The input means is comprised of a bubble domain generator 22 which provides bubble domains for insertion into lattice L, a shift register SR1 which moves the doamins from the generator 22 to positions where they can be inserted into lattice L, and a series of conductors A, B, C through which currents can be passed for creation of magnetic fields which insert the bubble domains into the lattice. This type of conductor input means is more fully described in aforementioned copending application Ser. No. 395,336.

An output means, generally desingated 24, is comprised of conductos A', B' and C'. These conductors have analogous functions to the conductors A, B and C in that currents through these conductors provide magnetic fields for pulling domains from the lattice L. This type of output means is also well described in copending applicaton Ser. No. 395,336.

After removal of a column of bubble domains 10 from the lattice, shift register means can be provided in the normal fashion for moving the domains to other parts of the magentic medium in which they exist. In this drawing, shift register SR2 is located between conductors B' and C' and can be, for instance, comprised of conductor loop patterns for moving domains in conventionally well known ways.

If desired, a bubble pump shift register of the type described in aforementiond copending application Ser. No. 429,602 can be used to provide bubble domains at the input of the lattice and for removing bubble domains at the output of the lattice.

In the description to follow, the input means 20 and output means 24 are utilized to provide the initial lattice. After an initial lattice is produced within the confinement means 12, the input and output means are no longer needed if other bubble domain generators are utilized, or if bubbles removed from the lattice are returned to the lattice.

A bias field source 26 provides a magnetic bias field $H_z$ substantially normal to the plane of the lattice L. Source 26 can be any of a number of well known sources, including permanent magnets, magnetic layers exchange coupled to the magnetic medium in which the bubble domains exist, and current carrying conductors. For instance, it may be desirable to have a different value of bias field within lattice L than the outside the lattice. Accordingly, the bias field source will provide a proper bias field over different regions of the magnetic sheet if that is desired. Of course, if a bubble pump propagation means is used for input and output of bubble domains from the lattice, a uniform field $H_z$ can be used throughout the magnetic medium. Techniques for doing this are within the skill of the art and are also described in aforementioned Ser. No. 395,336.

A source 28 provides an in-plane magnetic field H which can be used for various functions. For instance, such a field may be used for movement of magnetic domains in shift registers SR1 and SR2 located outside the lattice area.

Buffer zones 28L and 28R are located at the left-hand end of the lattice and at the right-hand end of the lattice, respectively. These buffer zones are comprised of stripe domains 30 and means 32L and 32R for generation and annihilation of these stripe domains. For instance, 32L is comprised of conductors 34A and 34B which are connected to buffer current sources 36A and 36B, respectively. On the right-hand end of the lattice, means 32R is comprised of conductors 38A and 38B, connected to buffer current sources 40A and 40B, respectively.

The operation of the generation and annihilation means 32L and 32R will be explained in more detail later. At this time it is appropriate to say that these structures are used to generate and annihilate stripe domains in the buffer zones 28L and 28R. This generation and annihilation of stripe domains is used to translate the lattice L to the left or to the right.

In FIG. 2, two write stations W-A and W-B are provided at the top of the lattice. At the bottom edge of the lattice, two read stations R-A and R-B are provided. In general, the write stations are used to produce magnetic domains which in turn are used to push bubble domains out of the lattice into the associated read stations. In the embodiment of FIG. 2, two columns of bubble domains 10 can be pushed out of the lattice into the associated read stations for detection of the information carried by the bubble domains. It should be noted that the generalized translation direction of the lattice is from left to right or right to left, while the removal of a column of bubble domains from the lattice is essentially transverse to this horizontal left ⇌ right direction.

Each write station is comprised of a bubble domain generator and a pusher for serially pushing domains into a bubble domain pump. In FIG. 2, two pumps P-A and P-B are provided for moving bubble domains in two columns out of the lattice L. Pump P-A is comprised of current carrying conductors 42L and 42R. These conductors are connected to pump current sources 44L and 44R, respectively.

Pump propagation means P-B is comprised of conductors 46L and 46R. These are connected to pump current sources 48L and 48R, respectively.

The operation of the pump propagation means P-A and P-B is explained in detail in aforementioned copending application Ser. No. 429,602. Essentially, currents in a pair of pump conductors cause expansion of domains between the conductors. This expansion causes other domains to move with the net result that propagation of domains occurs in the column defined by the pump conductors. This will be explained in more detail with respect to FIG. 3.

As mentioned, each write means is comprised of a domain generator and a pusher for serially pushing domains into the column defined by the adjacent pump conductors. For instance, write means W-A is comprised of a bubble domain generator 50A and a bubble domain pusher 52A. Pusher 52A is comprised of conductors 54L and 54R, which are connected to a pusher current source 56A. Generator 50A is comprised of a three-legged conductor structure in which the two outer legs 58 and 60 are connected to a current source 62A while metal conductor 64 is connected to ground.

Write means W-B is comprised of bubble domain generator and annihilator 50B and serial bubble domain pusher 52B. Generator 50B is comprised of conductors which are connected to current source 62B while pusher 52B is comprised of current carrying conductors connected to pusher current source 56B. Since generator 50B is the same as generator 50A and since pusher 52B is the same as pusher 52A, the details of write means W-B will not be further explained. Accordingly, the individual conductors of these components are not given reference numerals.

The operation of the write means W-A will be explained in more detail with respect to FIG. 4. Accordingly, at this point in the discussion, it is only necessary to state that the generator 50A can be used to nucleate and annihilate domains, as well as to split them. If properly designed, this generator will provide coded bubble domains for information storage. The pusher 52A will push domains in serial fashion into the column defined by the associated pump propagation means P-A.

Two read means R-A and R-B are provided for use with the associated write means W-A and W-B, respectively. Because the structure of means R-A is identical to that of R-B, only read means R-A will be described in detail.

Read means R-A is generally comprised of a bubble domain serial puller 66A, a bubble domain serial pusher 68A, and a bubble domain sensor 70A. Puller 66A is comprised of conductors 72L and 72R, which are connected to puller current source 74A. Serial pusher 68A is comprised of conductors 76L and 76R which are connected to a pusher current source 78A. Serial puller 66A moves bubble domains in serial fashion (one at a time) from the column of the associated bubble pump P-A. Serial pusher 68A is used to push bubble domains, one at a time, toward the direction of the Y-shaped confinement means 80A. As will be more clearly understood later, pusher 68A is also used to create a gradient magnetic field in the Y-shaped region defined by the boundaries 80A. This in turn is used to deflect the bubble domains in accordance with their wall magnetization structure. Accordingly, the domains can be detected for their information content by this technique.

Sensing means 70A is illustrated as comprising a conductor 82A connected to a sensing element 84A, which can conveniently be a magnetoresistive sensing element of the type well known in the art. A sensor current source 85A produces electrical current through sensor element 84A. In FIG. 2, an elongated bubble domain 86 is adjacent to the sensor 84A.

A conductor loop 88A is adjacent to the left-hand leg of the Y-shaped propagation channel while a conductor loop 90A is adjacent to the right-hand portion of the Y-shaped propagation path. Conductor loop 88A is connected to the current source 92A while conductor loop 90A is connected to current source 94A. Conductor loops 88A and 90A are used for expansion and collapse of domains in the respective portions of the Y-shaped propagation channel. That is, current in loop 90A will expand the domain 86 to provide a maximum signal to be sensed by detector 84A. Later this same conductor loop can be used to collapse the domain 86. The operation of the read means R-A will be described in more detail with respect to FIG. 5.

Since read means R-B is identical to read means R-A, it will not be explained in detail. Corresponding portions of read means R-B have the same reference numerals as those of means R-A, except that the suffix B is used.

A control means 95 sysnchronizes the operation of the various components used in the system of FIG. 2. Control 95 provides input trigger pulses to the pump current sources 44, pusher current sources 56, 78, puller current sources 74, input/output conductors A-C, A'-C', buffer current sources 36, 40, sensor current sources 85, in-plane field source 28, bias field source 26, annihilate/generate current sources 62, and current sources 92 and 94.

The pump propagation structure is a shift register that can be used for access (input/output) of bubble domains to and from the lattice L. Additionally, it is a one-dimensional lattice itself, since the bubble domains confined in it have positions largely determined by mutual interactions between the bubble domains. Consequently, the structure of FIG. 2 is comprised of two lattices (confined arrays) of magnetic bubble domains, where one lattice is two-dimensional while the other lattice is one-dimensional. Also, the first and second lattices include bubble domains which are common to each lattice, and the second lattice can be thought of as intersecting the first lattice.

Initialization of the Lattice

In the embodiment of FIG. 2, an input means 20 is provided for bringing bubble domains to the left-hand end of the lattice L. These domains can then be inserted into the lattice by the associated conductors. The force required to move the bubble domains into the lattice area is that which overcomes the repulsive force of bubble domains within the lattice. If there are no bubble domains within the lattice, the bubble domains which enter the lattice will spread out in order to minimize the energy of the lattice. These domains merely have to overcome the repulsive force of the barrier 12 in order to enter the lattice area. Consequently, bubble domains can be continually loaded into the lattice area until a number is reached which will provide a regular lattice having a given lattice spacing $a_0$ between bubble domains. For instance, $m$ columns having $n$ elements in a column may be placed in the lattice. After this, the lattice can be slightly perturbed by further input elements in order to remove any dislocations or vacancies from the initially formed lattice. That is, after the lattice is initially formed, additionally columns of bubble domains are entered into the lattice and a corresponding number removed from the lattice by the output means 24. This provides a filtering action and insures that all dislocations and vacancies will have translated through the entire lattice area to the output end where they are removed. This filtering operation may take one or more cycles in which the lattice is totally recycled.

An alternate technique for achieving an initial lattice of magnetic bubble domains is to first apply a large in-plane magnetic field (using source 28) to saturate the magnetic medium. After this, the in-plane magnetic field is released to obtain a dense, random array of bubble domains. The lattice is then magnetically annealed by a time-modulated magnetic field (produced by source 26) normal to the bubble domain material, in order to obtain a regular lattice.

Still another technique for providing an initial lattice is one which generates bubble domains at selected locations in a magnetic medium. For instance, a permanent magnet having a pattern of apertures in it (not shown) can be brought into close proximity to the magnetic medium, after the medium has been heated to a temperature above its Curie temperature $T_c$. This will cause nucleation of bubble domains in the magnetic sheet at locations corresponding to the pattern in the permanent magnet.

Another technique for providing an initial lattice of bubble domains utilizes stripe domains which can be cut. A pattern of stripe domains is produced by a magnetic field in the plane of the magnetic sheet, in a well known manner. These stripe domains are then cut to provide rows of bubble domains. The cutting device which produces a magnetic field of sufficient amplitude in a direction substantialy normal to the magnetic medium. As an example, a recording head can be moved across the stripe domain pattern in sequential fashion to cut the stripes, thereby producing rows of bubble domains. Another alternative would be to use a plurality of conductors arranged transversely to the direction of the stripe domains. Pulsing these conductors will produce magnetic fields which will cut the stripe domains, thereby leading to the row of bubble domains.

Steps for producing an initial lattice are known in the art and are described in some detail in aforementioned Ser. No. 395,336.

Operation of the Structure of FIG. 2

The following will be a generalized description of the functions which are performed in the structure of FIG. 2. The detailed operations of the various components of this structure will be explained with reference to the subsequent figures which show the various components.

Generation and annihilation of stripe domains 30 in the buffer zones 28L and 28R are used to move the lattice to the left or to the right. For instance, the lattice L will be shifted to the right when stripe domains are generated in buffer zone 28L and annihilated in buffer zone 28R. A reverse operation will shift the lattice to the left. This type of operaton will maintain the same number of bubble domains in the lattice during translation.

The lattice translation operation continues until the desired column of bubble domains is situated in the region between the appropriate bubble conductors. That is, the bubble domain column to be taken from the lattice must be in a proper input/output port.

Bubble domains in a selected column are then moved out of the lattice by pulsing the appropriate pump conductors. During this operation, the appropriate bubble domain generator will produce bubble domains which are serially entered into the lattice to maintain the proper spacing of elements within the lattice. The generator can also provide coded bubble domains in order to replenish the exact information taken from the lattice.

At the read end of the bubble domain pump, bubble domains are sensed and the sense signals can be sent to associated circuitry, such as a computer.

Figure 8:
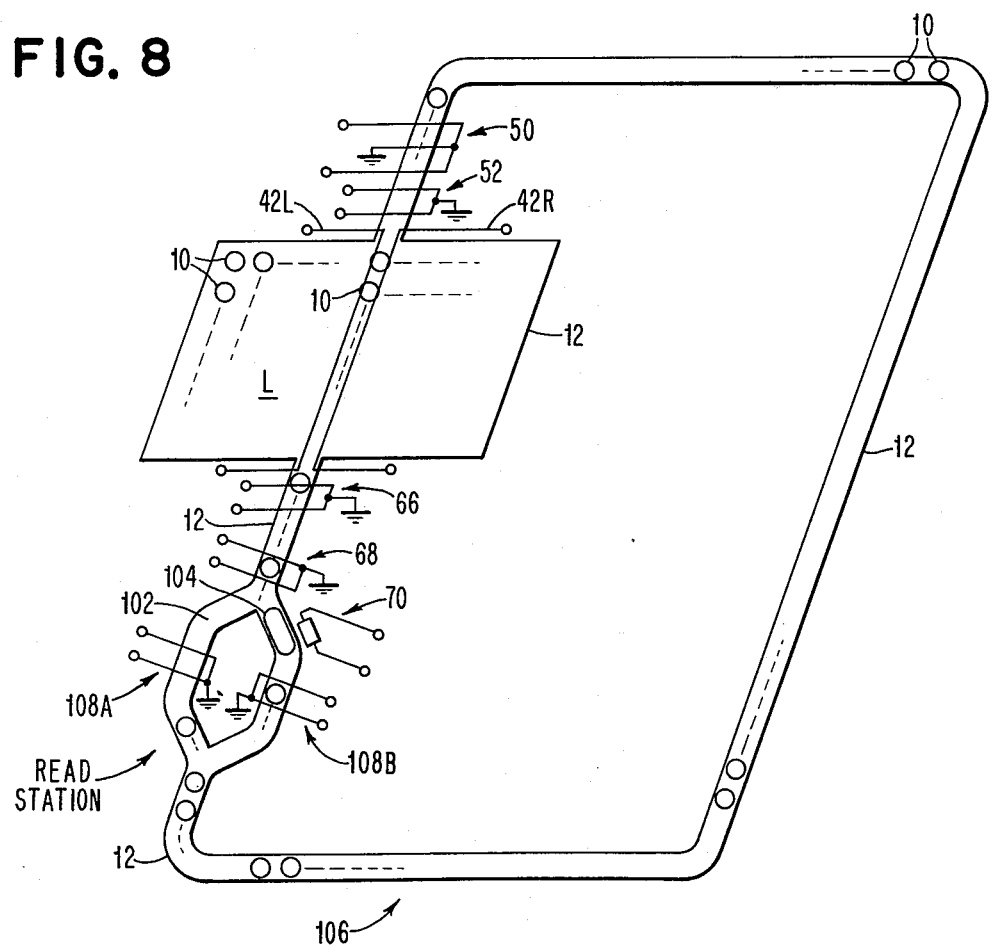
FIG. 8 is a circuit diagram showing a bubble domain lattice using column accessing in which information removed from the lattice is returned to the same locations within the lattice by the bubble domain pump.

As will be seen by reference to FIG. 8, techniques can be utilized to return the original bubble domains to their positions within the lattice after being removed from the lattice and read by a sensing station.

Additionally, it should be noted that the bubble domains need not be coded within the lattice, if the lattice is used for other types of applications. However, if the bubble domains are coded, any type of coding can be utilized. In the discussion to follow, the coding technique described in copending application Ser. No. 375,289, filed June 29, 1973, now U.S. Pat. No. 3,890,605 will be assumed as the type of coding used. Other types of coding may utilize the hard-soft properties of magnetic bubble domains (copending application Ser. No. 375,285, filed June 29, 1973, now U.S. Pat. No. 3,899,799), right and left-handedness of unichiral magnetic bubble domains (copending application Ser. No. 395,336), dual size magnetic bubble domains (copending application Ser. No. 319,130, filed Dec. 29, 1972, now U.S. Pat. No. 3,911,411), etc.

Description of the Various Components

Figure 3:
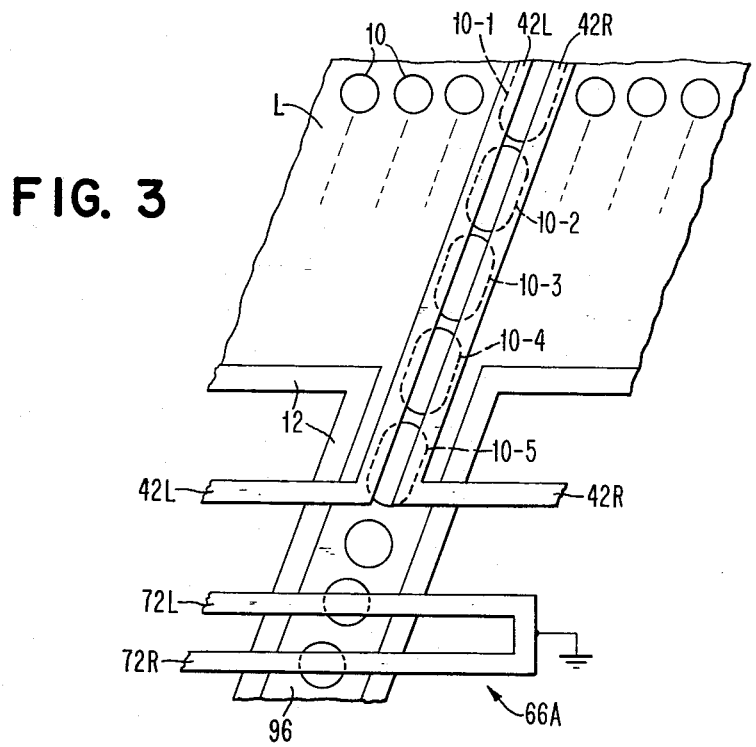
FIG. 3 is a diagram of a portion of FIG. 1, illustrating the input/output of bubble domains to/from a lattice.

FIG. 3 shows the structure used to provide input/output of bubble domains to/from a column in the lattice. The lattice L is comprised of bubble domains 10 and a column therein is defined by the pump conductors 42L and 42R. Although only a portion of these conductors as well as portions of other conductors are shown in this drawing, the amount of detail presented is sufficient to enable one to understand the operation of this component.

The serial puller 66A is also shown. This puller includes conductors 72L and 72R which form a U-shaped loop that is grounded at its mid-point.

In operation, bubble domains within the area defined by conductors 42L and 42R will be expanded when currents flow in these conductors. Expanded domains 10-1, 10-2, 10-3, 10-4, and 10-5 are shown in this drawing. Expainsion of these domains exerts forces on other domains in the column, causing movement of the domains in a downward direction. However, the bubble domains puller 66A insures that bubble domains entering the lower portion 96 of the column propagation path defined by barrier 12 enter it one at a time. As will be seen later, this provides control over the reading station in order to be able to detect each separate domain.

When the current in the pump conductors is removed, the expanded domains 10-1 . . . 10-5 shrink and other domains from the associated write means W-A enter the areas that the expanded domains have vacated. Thus, there is a continual downward push of bubble domains in the column defined by the pump conductors 42L and 42R.

Because the pump propagation means is symmetrical, bubble domains can be pushed upwardly in the column if such is desired. However, operation of the structure of FIG. 2 moves bubble domains downwardly to the read station for detection thereat.

In the input/output operation of the column accessing structure, the associated generator 50A will provide a single bubble domain each time one is required for movement into the column. The associated pusher 52A will cause serial movement of these bubble domains into the bubble pump structure. Accordingly, use of the serial pushers and pullers insures that a fixed amount of bubbles is always present in the column and that synchronization of the column accessing will occur. In the manner, the control unit 95 can keep track of the domains which are read from the lattice area.

The bubble domain pump structure can be used to provide a regular lattice. In this case, an array of bubble domains is produced within confinement means 12 through the use of a large in-plane magnetic field (several thousand Oe) which is then reduced to zero. This produces an array of bubble domains within confinement means 12. By modulating a perpendicular bias field $H_z$, the array will move into a lattice configuration. At this time, the bubble domain pump structure can be used to insure that a proper number of bubble domains is present in each column.

As an example, assume that an array of 100 by 100 bubbles is required. This means that there will be 100 columns, each of which has 100 bubble domains therein. The bubble domain pump conductors are used to line up a bubble domain column between the conductors. At this time, a high current in the pump conductors will force all of the bubble domains between the conductors to move together to create a single strip domain between the conductors. If the current in the pump conductors is then reduced, this strip domain will get smaller and become a single bubble domain. The generator and pusher associated with the pump conductors is then activated to produce 99 domains. Since only one domain was present in the column located between the pump conductors, insertion of 99 domains in serial fashion will provide a column having exactly 100 domains therein.

Accordingly, the associated serial pusher on one end of the pump propagation means and the associated serial puller on the other end of the propagation means can be used to define the length of the bubble domain column. Each end of the bubble domain pump can be opened (to allow bubble domains to pass) or closed (to restrict movement of bubble domains).

After a 100-bubble domain column has been formed, this column can be shifted in the lattice by using the buffer zones as described previously. At this time, another column of bubble domains (which may or may not have the proper amount of domains) is moved into the area between the pump conductors and is treated as described previously. This continues unitl 100 columns having 100 bubble domains in each column are produced.

FIG. 4

Figure 4:
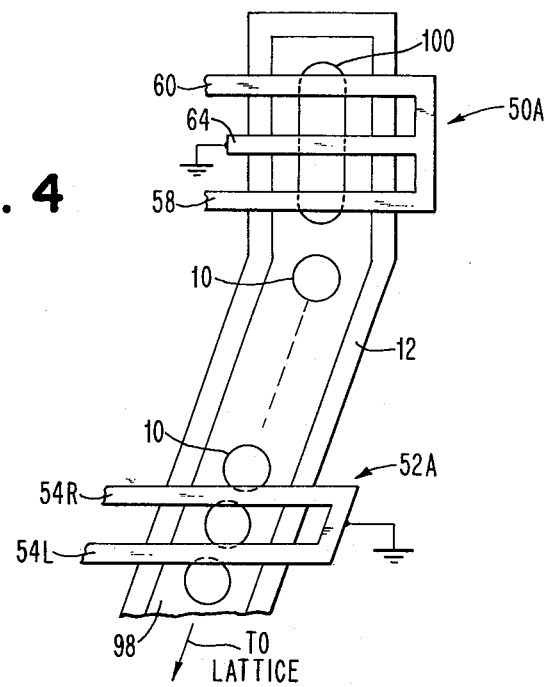
FIG. 4 is a diagram of a portion of the structure of FIG. 2, showing the structure used for nucleation, expansion, splitting, annihilation, and propagation of domains within a bubble domain pump used for column accessing.

FIG. 4 is a diagram of the bubble domain generator 50A and bubble domain serial pusher 52A. Generator 50A can perform the functions of nucleation, expansion, splitting, annihilation, and propagation. Pusher 52A is used to move bubble domains one at a time to the lattice, as indicated in FIG. 4.

The constraining border for the bubble domain pump is indicated by the solid line 12. This confining means can be, for instance, ion implanted regions of the magnetic bubble domain material grooves, etc. which create a barrier to restrain the bubble domains 10 within this barrier.

Generator 50A is comprised of a three-legged current carrying conductor structure, with the two outer conductors being 58 and 60 while the inner conductor is 64. Outer conductors 58 and 60 are connected to a current source 62A which is not shown in this drawing.

Serial pusher 52A is comprised of a U-shaped conductor having portions 54L and 54R which are tied to ground at their midpoint. Conductors 54L and 54R are connected to pusher current source 56A (not shown in this figure).

Generator 50A can be used to nucleate bubble domains in the following way. For typical rare earth iron garnet bubble domain materials, a current of 300 –400 milliamps in either conductor 58 or conductor 60 will create a localized magnetic field adjacent to the conductor which will nucleate a domain. At this time, the bias field $H_z$ normal to the bubble domain medium can be approximately zero or set at the bias for operation of the lattice.

Once the initial domain is nucleated, generator 50A merely splits off bubble domains from it for propagation to the lattice. The splitting operation is accomplished by putting currents into conductors 58 and 60. This causes the initial domain 100 to expand as shown in the drawing. During this stretching operation, magnetic fields are established which pinch the bubble 100 at its center, causing it to split. The currents used for this operation are about 100 milliamps.

The split domain is then attracted by pusher 52A by putting a current through conductor 54L. Current through conductor 54R holds bubble domains on the right-hand side of this conductor during the operation. The currents utilized have amplitudes of approximately 10 milliamps. The bubble domains 10 are then pushed in serial fashion to the lattice. By pulsing the pump conductors, the bubble domains in the lattice will be expelled as described with reference to FIG. 3.

FIG. 5

Figure 5:
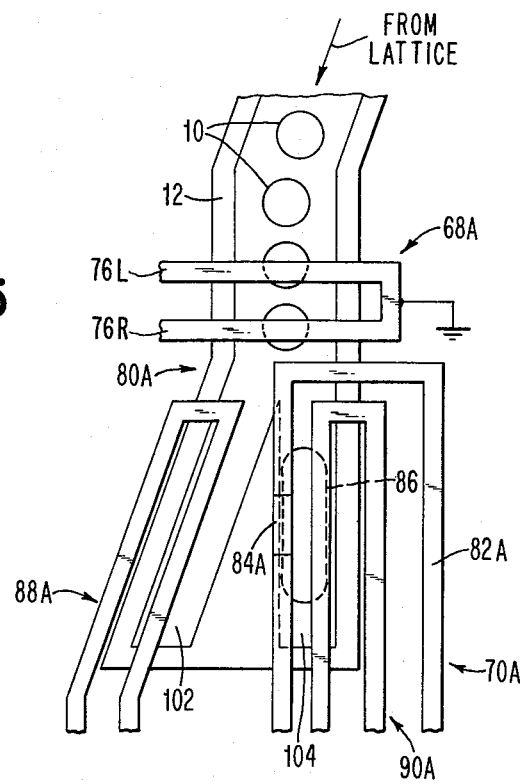
FIG. 5 is an illustration of a portion of the structure of FIG. 2, showing in particular the apparatus used to read information taken from the lattice.

FIG. 5 shows the read means R-A used to detect domains from the lattice which have been coded in terms of their wall magnetization rotation. This type of coding is described in more detail in aforementioned copending application Ser. No. 375,289. Briefly, magnetic bubbles can be made to deflect through different angles in a gradient magnetic field normal to the magnetic medium depending upon the number of rotations of their wall magnetization. Thus, the propagation channel in FIG. 5 branches into a Y in order to allow bubble domains to deflect into either one of the legs of the propagation channel. Sensors then detect the bubble domains and an indication is obtained of the information contained within the lattice.

In more detail, FIG. 5 shows the serial bubble domain pusher 68A which is comprised of conductors 76L and 76R which are tied to a common ground. Conductors 76L and 76R are connected to pusher current source 78A, which is not shown in this drawing.

The sensing means 70A is comprised of a sensing element 84A which is connected to a current carrying conductor 82A. In a preferred embodiment, sensor 84A could be a magnetoresistive sensor which is operated in a manner well known in the prior art (U.S. Pat. No. 3,691,540). Current sources 78A, 85A, 92A and 94 A are not shown in this figure.

In operation, bubble domains 10 are pushed out of the lattice by the bubble pump means and move downwardly to the serial pusher 68A. This pusher allows one bubble domain at a time to cross the Y-shaped region of the propagation path, in order to determine the deflection properties of the bubble domains. Current through conductor 76R provides a magnetic field gradient in the direction of the Y-shaped grooves and individual domains move downwardly under the influence of this gradient field. Depending upon the deflection properties of a domain, it moves either to the left-hand path 102 or to the right-hand path 104. At this time, current is put into conductor loop 90A which causes the domain 86 to be expanded. This expanded domain is detected by sensor 84A and a signal can be fed to external circuitry, such as a computer. After being sensed, current through conductor loop 90A is reversed to collapse the domain 86.

A sensor is not needed to detect bubble domains moving in path 102. Since the domains were coded in a prescribed way initially, any domain which moves into path 102 can be detected by noting the absence of a signal produced by element 84A at that time. If a domain moved into path 102, it would be collapsed by a magnetic field due to current in conductor loop 88A.

For the reading technique of FIG. 5, bubble domains must be albe to freely float in a gradient magnetic field produced by pusher 68A. Therefore, domains in paths 102 and 104 which have been sensed are collapsed before the serial pusher 68A sends another domain through the gradient field. This insures that the domains deflect properly in the gradient magnetic field, rather than undergoing deflection due to the influence of other domains.

FIG. 6

Figure 6:
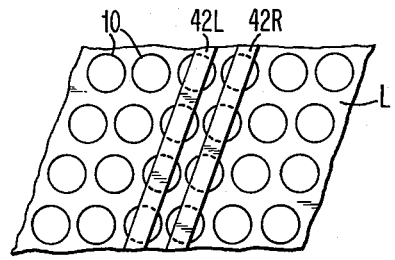
FIG. 6 illustrates a portion of the structure of FIG. 2, showing in particular the propagation of bubble domains within the lattice.

FIG. 6 illustrates propagation of magnetic bubble domains 10 within the lattice L. As stated previously, domains 10 propagate in a horizontal direction either to the left or to the right depending upon the generation and annihilation of stripe domains in the buffer regions 28L and 28R. This translation of motion of the lattice is used to place a column of bubble domains between the pump conductors 42L and 42R.

For proper placement of the bubble domains between the pump conductors, currents can be put in individual pump conductors in order to move a column of bubbles into the region between the two conductors. Thus, it is possible to fine-tune the motion of the desired column of lattice bubbles which are to be removed from the lattice.

FIG. 7

Figure 7:
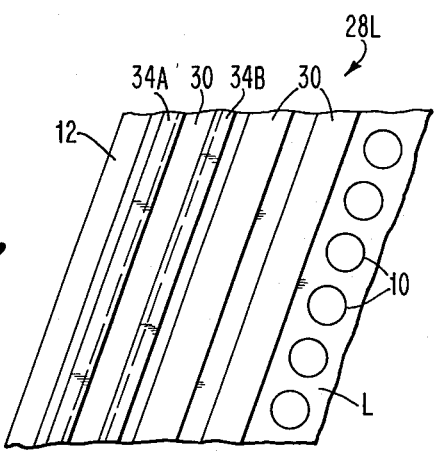
FIG. 7 illustrates a portion of the structure of FIG. 2, showing in particular the generation and annihilation of domains at the buffer zones of the lattice.

FIG. 7 shows a portion of the buffer zone 28L including the barrier 12 and the generate/annihilate conductors 34A and 34B. These conductors are connected to buffer current sources 36a and 36B respectively, which are not shown in this drawing.

At this time it should be remembered that the function of the buffer zones is to translate the bubble domain lattice to the left or to the right. This is done by the controlled generation and annihilation of stripe domains in the buffer zones on either side of the lattice.

Initially, the entire area surrounded by the confinement barrier 12 contained a perfect lattice. At this time, current is put into conductors 34A and 34B. These currents will create magnetic fields which will squeeze the bubble domains located between conductors 34A and 34B. The bubble domains thus squeezed will merge into a stripe domain 30 which will remain between conductors 34A and 34B.

At the same time the conductors 38A and 38B in buffer zone 28R are energized in the opposite direction in order to collapse the row of bubble domains which is located between them. Consequently, the entire lattice is now arranged such that it can be shifted to the right by one column width. To do so, current is passed through conductor 34B in a direction which attracts the stripe domain between conductors 34A and 34B to the right-hand side of conductor 34B. During this operation, a current in the proper direction in the left-hand conductor 34A may be used to aid movement of the stripe domain to the right.

Additional stripe domains may be created between conductors 34A and 34B by applying currents of approximately 400 -500 milliamps in these conductors. The localized magnetic field produced between the conductors will nucleate domains between these conductors. If the currents through the conductors are reduced, these domains will expand to the length of the lattice in order to form a new stripe domain.

Continued nucleation of stripe domains in the left-hand buffer zone and collapse of bubble domain rows in the right-hand buffer zone will produce a number of stripe domains 30 in the left-hand buffer zone. At this time, the lattice is shifted to the left and one-half of the stripe domains created in the left-hand buffer zone are collapsed by applying large currents to the conductors 34A and 34B. This creates a large magnetic field for annihilation of domains between these conductors. At the same time, new stripe domains are being generated on the right-hand side of the lattice.

This operation continues until approximately one-half of the stripe domains initially produced in the left-hand buffer zone have been collapsed and a corresponding number of stripe domains have been formed in the right-hand buffer zone. Thus, an arrangement is obtained having equal amounts of stripe domains in both the left-hand buffer zone and the right-hand buffer zone.

The number of stripe domains required in the buffer zones depends on the size of the lattice and on the number of input/output ports. That is, there must be a sufficient number of stripe domains to be able to move all bubble domains within the lattice to a column for accessing. Generally, for a lattice containing 100 columns of 100 bubbles, with 1 input/output column at the center of the lattice, about 50 stripe domains will be required in each buffer zone. However, if there are two input/output column accessing ports spaced 1/3 and 2/3 of the distance from the ends of the lattice, then 34 stripe domains will be required in each buffer zone.

The stripe domains have approximtely the same width and spacing as the bubble domains within the lattice. Therefore, it can be readily calculated how many stripe domains are needed for a lattice of a given size in a given area, with a given amount of input and output column accessing ports. The fundamental principle is that the buffer zones should have sufficient numbers of stripe domains to insure that all bubble domains will be able to be translated to a column for accessing from the lattice. During this translation operation, the total number of stripe domains in both buffer zones remains constant.

FIG. 8

FIG. 8 illustrates a lattice system in which column accessing is used to remove bubble domains from the lattice. However, this system differs from that shown in FIG. 2 in that the bubble domains removed from the lattice are returned to the lattice after being sensed.

Whenever possible, the same reference numerals will be used for the embodiment of FIG. 8 as were used for the other embodiments. Therefore, a lattice L comprised of magnetic bubble domains 10 is present within the confinement means 12. The confinement means also defines a closed loop propagation path generally designated 106. This propagation path is used to move magnetic bubble domains around the lattice for re-entry therein after being sensed. Additionally, propagation pump conductors 42L and 42R are provided for moving bubble domains into and out of the lattice L. The bubble domain pusher 52 is provided as well as bubble domain generator/splitter/ collapser 50.

On the other side of the lattice, a bubble domain puller 66 is provided as well as bubble domain serial pusher 68. Bubble domain pusher 52 and bubble domain puller 66 can be selectively opened and closed to allow the bubble domains to move into and out of the lattice L.

A bubble domain sensor 70 is provided and in addition, bubble domain puller/pushers 108A and 108B are also provided. Pushers 108A and 108B are used to move magnetic bubble domains which have been deflected by a gradient field produced by pusher 68. Accordingly, they move magnetic bubble domains in the two propagation paths 102 and 104 into the closed loop 106 so that other bubble domains can be detected.

In operation, the entire loop 106 can be filled with magnetic bubble domains. This means that application of current to the pump conductors 42L and 42R will expand domains in the lattice, thereby causing domains to be moved to the pusher 68. This pusher allows one domain at a time to move in the gradient magnetic field. Accordingly, a domain in that field will move either into path 102 or path 104 depending upon its wall magnetization state. Sensor 70 is then used to detect the domains after which they are moved further along their respective paths by either pusher 108A or pusher 108B. These pushers are synchronized so that the relative order of the bubble domains is retained as they proceed toward closed loop 106. That is, by alternately pulsing pushers 108A and 108B, the same order for magnetic bubble domain movement will be provided.

By repeatedly pulsing conductors 42L and 42R, domains within the lattice L will be sent to the read station, detected, and then returned to their proper places back in the lattice.

If the loop 106 is not initially loaded with magnetic bubble domains, generator 50 can be used to provide domains for pushing other domains out of the lattice and around the loop 106. For instance, it may be desired to push 25 bubble domains at a time out of the column of the lattice to be accessed. To do this, pusher 52 is closed (that is, current in this pusher prevents bubble domains in the lattice from moving upwardly past pusher 52) and puller 66 is opened (that is, no current flows in puller 66 so that bubble domains can exit from the lattice in a direction toward this puller).

At this time, puller 66 is closed and pusher 52 is opened. A nucleated domain produced by generator 50 is then split and placed in the column where domains have left. Twenty-five new domains are produced by generator 50 which are pushed by pusher 52 into the column, thereby replacing the 25 domains which have been removed from the lattice.

Pusher 52 is then closed and puller 66 is opened in order to repeat the operation for another 25 domains. This continues until all domains within the lattice column to be accessed have been removed from the lattice and detected. The bubble pump conductors are then utilized to move domains around closed loop 106 until the original domains within the lattice are returned to the same positions within the lattice.

Synchronization of the various functions performed by the different components in the structure of FIG. 8 can be accomplished by an external control means such as that described with respect to FIG. 2. Such circuitry is well known in the electronics art and utilizes clocking and timing pulses for triggering current sources used to activate the various components.

In the operation of column accessing in accordance with the present invention, bubble domain spacing within the lattice is established in a manner which allows a column of bubble domains to be removed from the lattice. That is, enough lattice flexibility exists such that a desired column of bubble domains can be moved by the bubble pump conductors into and out of the lattice. For instance, a lattice constant (center-to-center domain spacing) of approximately 2 bubble diameters can be utilized, in a typical lattice system.

What has been described is an improved technique for accessing interactive elements contained within a lattice of such interactive elements. These interactive elements can be any type of elements which tend to repel one another. A particularly useful example is comprised of a lattice of magnetic bubble domains. The present accessing technique can remove columns of the interactive elements from the interior of the lattice, rather than having to translate the column to be accessed to one end of the lattice. That is, the interactive elements are removed from the lattice in a direction substantially transverse to the usual translation direction of elements within the lattice.

The interactive elements within the lattice can be moved in the lattice by conventional means or by using end buffer zones for shifting the lattice in two directions. Whatever the means for moving the lattice, a column of bubble domains in the lattice can be quickly accessed, detected, and returned to the lattice. As an alternative, the detected elements can be annihilated and the information rewritten into the lattice by other similarly coded interactive elements.

What is claimed is:

1. A method for extracting interactive elements from a confined two-dimensional lattice array of said elements which are spaced such that interactions exist between said elements in said array, wherein said method comprises
   moving said elements in a first direction in said lattice array, and
   removing elements from said lattice array in a direction substantially transverse to said first direction.

2. The method of claim 1, including the further step of returning said removed elements to their original positions within said confined array.

3. The method of claim 1, including the further step of putting new elements into the positions within said array previously occupied by said elements which have been removed from said array.

4. The method of claim 1, where said confined array is arranged in columns of said elements where said first direction of movement is substantially transverse to the direction of said columns and said second direction is substantially along the direction of said columns.

5. The method of claim 1, including the further step of moving selected elements in said confined array to selected positions therein prior to removing the selected elements from said array.

6. An apparatus, comprising:
   a lattice of magnetic bubble domains, the domains in said lattice being sufficiently close to one another that interactive forces exist between adjacent domains,
   translation means for moving said lattice comprised of first and second buffer zones located adjacent to opposing sides of said lattice, where said buffer zones contain stripe domains therein,
   means for controllably changing the areas occupied by said stripe domains in said buffer zones, including means for expanding the area occupied by stripe domains in said first buffer zone and means for reducing the area occupied by stripe domains in said second buffer zone to move bubble domains in said lattice in a first direction.

7. The method of claim 1, where said elements are magnetic bubble domains.

8. A method for accessing interactive elements from a confined array of such elements, where the elements in said array are spaced from one another and interactions exist between adjacent elements and where said array includes columns of said interactive elements, said method including the steps of:
   substantially maintaining the density of said elements in said confined array and shifting said columns of elements in said array in a first direction substantially transverse to the longitudinal direction of said columns,
   substantially maintaining the density of said elements in said confined array and removing a column of said elements from said confined array where said column is removed in a direction substantially along the longitudinal direction of said column.

9. The method of claim 8, where said shifting is achieved by generating and annihilating additional interactive elements in regions adjacent to opposing ends of said confined array.

10. The method of claim 8, wherein more than one column of interactive elements is removed at a time from said array.

11. The method of claim 8, wherein elements which are removed from said confined array are returned to the same positions within said array.

12. A system utilizing elements which can interact with one another, including
   a carrier for supporting said elements,
   confinement means for confining said elements in an array having a given density of said interactive elements where said elements are spaced from one another and interact with one another,
   translation means for moving said elements in a first direction in said confined array.
   access means for accessing elements in said array in a second direction substantially transverse to said first direction and means for substantially maintaining the density of said elements in said array.

13. The system of claim 12, where said access means includes means to place elements into selected positions in said confined array.

14. The system of claim 12, where said access means includes means for removing interactive elements from said confined array.

15. The system of claim 12, including means for returning elements removed from said confined array to their original positions in said array.

16. The system of claim 12, including means for generating new interactive elements for replacing those interactive elements removed from said array.

17. A system utilizing elements which can interact with one another, including:
   a carrier for supporting said elements,
   confinement means for confining said elements in an array where said elements are spaced from one another and interact with one another,
   translation means for moving said elements in a first direction in said confined array,
   access meand for accessing elements in said array in a second direction substantially transverse to said first direction, where said access means includes means for producing electromagnetic fields which act on said interactive elements within said confined array and further confinement means for restricting the motion of said elements outside said confined array.

18. The system of claim 17, including generating means for producing interactive elements.

19. The system of claim 17, further including detection means for sensing said interactive elements.

20. The system of claim 17, including buffer zones of additional interactive elements on opposing ends of said confined array and means for generating and annihilating said additional interactive elements.

21. A system for moving magnetic bubble domains in a magnetic medium, comprising:
a confinement means for confining an array of said bubble domains in a region of said magnetic medium where said domains are sufficiently close to one another that they interact with each other to form a two-dimensional lattice of bubble domains,
translation means for moving said bubble domains in said array in a first direction in said array,
access means for accessing said bubble domains into and out of said lattice in a direction substantially transverse to said first direction, and
means for substantially maintaining the size of said lattice.

22. The system of claim 21, further including means for returning accessed bubble domains from said confined array to their original positions in said confined array.

23. The system of claim 21, where said translation means includes means for generating and annihilating strip bubble domains on opposing ends of said confined array.

24. The system of claim 23, further including control means to initiate generation of strip domains on one end of the confined array and annihilation of strip bubble domains on an opposing end of said confined array.

25. The system of claim 21, further including a bias field source for providing a magnetic bias field for stabilization of said bubble domains in said magnetic medium.

26. The system of claim 25, wherein said magnetic bias field has the same magnitude in said confined array as in said accessing means.

27. The system of claim 21, where said access means includes means for producing magnetic fields acting on said selected bubble domains for changing the size of these domains, and further confinement means for confining bubble domains located outside said confined array.

28. The system of claim 27, further including generating means for generating new bubble domains in locations outside of said confined array.

29. The system of claim 27, further including detection means for detecting said bubble domains.

30. The system of claim 27, further including generating means for generating additional bubble domains and detection means for sensing bubble domains.

31. The system of claim 27, including buffer zones of additional interactive elements on opposing ends of said confined array and means for generating and annihilating said additional interactive elements.

32. A system for manipulating magnetic bubble domains in a magnetic medium, comprising:
a lattice comprised of columns of magnetic bubble domains which are located in positions at least partially determined by interactions existing between said magnetic bubble domains,
means for translating a selected column of magnetic bubble domains in a first direction to a selected location,
means for removing said selected column from said lattice in a second direction.

33. A system for manipulating bubble domains in a magnetic medium, comprising:
a lattice comprised of columns of magnetic bubble domains, the domains in said columns being sufficiently close to one another that interactions exist between adjacent domains,
a bubble domain shift register for moving magnetic bubble domains, said shift register crossing said lattice in a direction defined by the direction of said columns of bubble domains in said lattice, and
means for controlling the movement of bubble domains in said shift register.

34. The system of claim 33, further including regions containing stripe domains on opposing ends of said lattice.

35. A system for magnetic bubble domains in a magnetic medium, comprising:
first and second lattices comprised of magnetic bubble domains, wherein the magnetic bubble domains in each lattice are sufficiently close to other bubble domains in the same lattice that they can interact therewith, said first and second lattices being characterized by having magnetic bubble domains common to both lattices and wherein
said first lattice is a two-dimensional lattice and said second lattice is a one-dimensional lattice which intersects said first lattice,
means for removing bubble domains common to both lattices from said first lattice.

36. A system using magnetic bubble domains in a magnetic medium, comprising:
a lattice comprised of columns of magnetic bubble domains which are sufficiently close to each other that interactions occur therebetween, and
means for removing a plurality of said columns of bubble domains from said lattice at the same time, said means including means for substantially maintaining the integrity of said lattice when said plurality of columns is removed therefrom.

37. An apparatus for accessing moving magnetic bubble domains selectively in a lattice array of such domains where the domains in said lattice have positions substantially determined by interaction forces existing between said domains, said apparatus including access means comprising:
confinement means intersecting said lattice for channeling motion of bubble domains within said confinement means,
pump means for applying a magnetic field to selected ones of said bubble domains located within said confinement means for altering the distance between domains within said confinement means, and
holding means for holding in a substantially fixed position at least one bubble domain located in said confinement means while said pump means applies said magnetic field to said selected domains in said confinement means.

38. The apparatus of claim 37, including additional access means intersecting said lattice at different locations than said first mentioned access means.

39. The apparatus of claim 37, where said confinement means includes conductor means extending across said lattice.

40. The apparatus of claim 39, where said pump means comprises current carrying conductors.

41. A bubble domain apparatus, comprising:
first confinement means for confining an array of magnetic bubble domains whose positions within said confinement means are substantially determined by interaction forces existing between said domains, second confinement means extending transversely to said first confinement means, pump means for changing the size of magnetic bubble domains located in said second confinement means, and holding means for holding in a substantially fixed position at least one bubble domain in said second confinement means when said domains in said second confinement means are changed in size.

42. The apparatus of claim 41, where said second confinement means is comprised of current carrying conductors.

43. The apparatus of claim 41, further including annihilation means for annihilating domains in said second confinement means.

44. The apparatus of claim 41, including means for moving selected domains in said lattice to positions within said second confinement means.

45. The apparatus of claim 41, further including generation means for producing domains in said second confinement means and sensing means for detecting domains in said second confinement means.

46. The apparatus of claim 45, where said pump means and said generation means are comprised of current carrying conductors.

47. An apparatus for moving an array of bubble domains, said array being comprised of magnetic bubble domains whose positions in the array are substantially determined by interaction forces existing between domains in the array, comprising:

buffer zones located on opposing ends of the array, said buffer zones being comprised of magnetic domains, means for generating and annihilating said magnetic domains in said buffer zones.

48. The apparatus of claim 47, where said domains are stripe domains.

49. A method for translating a lattice of interacting bubble domains along a first direction, comprising the steps of:

establishing a region containing stripe bubble domains, said region being sufficiently close to said lattice that said stripe domains interact with at least some of said bubble domains in said lattice, changing the number of said stripe domains in said region to alter the interaction between said stripe domains and said bubble domains in said lattice, and substantially maintaining the density of said lattice.

50. The method of claim 49, including the further step of establishing a second region containing stripe domains which interact with at least some of the bubble domains in said lattice, and changing the number of stripe domains in said second region.

51. An apparatus, comprising:

a lattice of interactive elements confined in a region where said elements interact with one another, translation means for translating said lattice while substantially retaining the size of said lattice and the relative positions of said elements within said lattice with respect to one another, said translation means including buffer zones on opposing ends of said lattice, said buffer zones containing further interactive elements.

52. The apparatus of claim 51, further including means associated with each said buffer zone for changing the number of interactive elements therein.

53. The apparatus of claim 51, where said interactive elements are magnetic bubble domains.

54. The apparatus of claim 53, where stripe magnetic domains are located on opposing ends of said lattice.

* * * * *